US006791341B2

(12) United States Patent
Shenai et al.

(10) Patent No.: US 6,791,341 B2
(45) Date of Patent: Sep. 14, 2004

(54) CURRENT DERIVATIVE SENSOR

(75) Inventors: Krishna Shenai, Naperville, IL (US); Erik A. McShane, Lockport, IL (US)

(73) Assignee: Shakti Systems, Inc., Lisle, IL (US)

( * ) Notice: Subject to any disclaimer, the term of this patent is extended or adjusted under 35 U.S.C. 154(b) by 36 days.

(21) Appl. No.: 10/217,894

(22) Filed: Aug. 12, 2002

(65) Prior Publication Data

US 2003/0034770 A1 Feb. 20, 2003

Related U.S. Application Data

(60) Provisional application No. 60/311,653, filed on Aug. 10, 2001.

(51) Int. Cl.$^7$ .......................... G01R 27/28; H01H 31/02
(52) U.S. Cl. ............... 324/654; 324/117 H; 324/117 R; 324/537
(58) Field of Search ................................ 324/433, 435, 324/117 R, 117 H, 713, 522, 537

(56) References Cited

U.S. PATENT DOCUMENTS

| | | | | |
|---|---|---|---|---|
| 4,965,548 A | | 10/1990 | Fayfield ...................... | 340/511 |
| 5,451,881 A | * | 9/1995 | Finger ......................... | 324/433 |
| 5,481,446 A | | 1/1996 | Timmins ...................... | 363/41 |
| 5,485,393 A | | 1/1996 | Bradford ..................... | 364/483 |
| 5,523,676 A | | 6/1996 | Bach et al. .................. | 324/103 |
| 5,539,354 A | | 7/1996 | Carsten ....................... | 327/559 |
| 5,568,047 A | | 10/1996 | Staver et al. ................ | 324/127 |
| 5,570,034 A | | 10/1996 | Needham et al. ........... | 324/763 |
| 5,736,846 A | | 4/1998 | Floru et al. .................. | 324/127 |

(List continued on next page.)

FOREIGN PATENT DOCUMENTS

| | | |
|---|---|---|
| EP | 0 441 649 A2 | 8/1991 |
| EP | 0 473 428 A2 | 3/1992 |

OTHER PUBLICATIONS

A. Van den Bossche and J. Ghijselen, "EMC Combined di/dt Current Probe," *IEEE Int. Symp. Electromagnetic Compatibility*, 2000, pp. 569–573, no month available.

B. Jin, "Modeling and Implementation of a Smart Current Sensor," *Proc. Int. Conf. Power Electronics and Motion Control*, 1992, pp. 1550–1555, no month available.

C. G. Knight et al, "An IDDQ Sensor for Concurrent Timing Error Detection," *IEEE J. Solid–State Circuits*, vol. 33, No. 10, pp. 1545–1550, 1998, Oct. 1998.

J. P. Hurst and A. D. Singh, A Differential Built–In Current Sensor Design for High Speed IDDQ Testing, *IEEE J. Solid–State Circuits*, vol. 32, No. 1, pp. 122–125, Jan. 1997.

N. Karrer and P. Hofer–Noser, "A new current measuring principle for power electronic applications," *IEEE Int. Symp. Power Semiconductor Devices and ICs (ISPSD)*, 1999, pp. 279–282, no month available.

N. Karrer and P. Hofer–Noser, "PCB Rogowski Coils for High di/dt Current Measurement," *Proc. IEEE Power Elec. Spec. Conf. (PESC)*, 2000, pp. 1296–1301, no month available.

S. Bracho et al, "An Approach to Mixed Circuits Testing," *Proc. European Test Conf.*, 1993, pp. 503–504, no month available.

*Primary Examiner*—N. Le
*Assistant Examiner*—Vincent Q. Nguyen
(74) *Attorney, Agent, or Firm*—McDonnell Boehnen Hulbert & Berghoff LLP

(57) ABSTRACT

A system and method for detecting, measuring, and reporting a time derivate of a current signal (di/dt). A sensing element detects current from a load. The sensing element includes an inductor. The inductor is located in series with the load and includes associated parasitic resistance. A differential potential develops across the inductor and the parasitic resistance. The differential potential is amplified and converted to a single-ended value. The single-ended value is then fed to an analog to digital converter that provides an output representative of di/dt.

71 Claims, 7 Drawing Sheets

U.S. PATENT DOCUMENTS

| | | | |
|---|---|---|---|
| 5,811,965 A | 9/1998 | Gu | 324/117 |
| 5,834,934 A | 11/1998 | Baurand et al. | 324/127 |
| 5,841,272 A | 11/1998 | Smith et al. | 324/117 |
| 5,920,189 A | 7/1999 | Fisher et al. | 324/115 |
| 5,923,162 A | 7/1999 | Drafts et al. | 324/117 |
| 6,005,383 A | 12/1999 | Savary et al. | 324/117 |
| 6,018,700 A | 1/2000 | Edel | 702/60 |
| 6,094,044 A | 7/2000 | Kustera et al. | 324/127 |
| 6,121,766 A | 9/2000 | Beardmore | 324/106 |
| 6,184,672 B1 | 2/2001 | Berkcan | 324/117 |
| 6,191,989 B1 | 2/2001 | Luk et al. | 365/207 |
| 6,222,283 B1 | 4/2001 | Regla | 307/117 |
| 6,242,920 B1 * | 6/2001 | Nelson et al. | 324/427 |

* cited by examiner

CURRENT DERIVATIVE SENSOR

RELATED APPLICATION

This application claims priority to and incorporates by reference U.S. Provisional Application Ser. No. 60/311,653 filed Aug. 10, 2001.

FIELD

The present invention relates generally to current sensors, and more particularly, relates to a current derivative sensor.

BACKGROUND

The ability to detect, measure, and record a rate of current change may be critical in high-speed electronic applications. The rate of current change may be referred to as a slope of a current signal, or alternatively, as a time derivative of a current signal (di/dt). The rate of the current change may be important when accounting for unwanted noise, such as electromagnetic interference (EMI) and radio-frequency interference (RFI), generated by high-speed circuits. However, most current sensors detect and measure only the magnitude of the current, and not the rate of current change.

Often the slope of the current signal is determined using computer simulation techniques, such as finite element analysis, lumped element simulation, and behavioral modeling. These computer techniques can become computationally intensive and include limiting assumptions, which may reduce the accuracy of the simulation result. Therefore, it would be beneficial to make a direct measurement of di/dt using a current derivative sensor.

SUMMARY

A current derivative sensor and a method for detecting, measuring, and recording a time derivative of a current signal (di/dt) are provided. A sensing element detects current. The current flows through the sensing element, generating a differential potential across the sensing element. A gain circuit amplifies and converts the differential potential to a single-ended output. An analog to digital converter converts the single-ended output and provides an output representative of di/dt.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
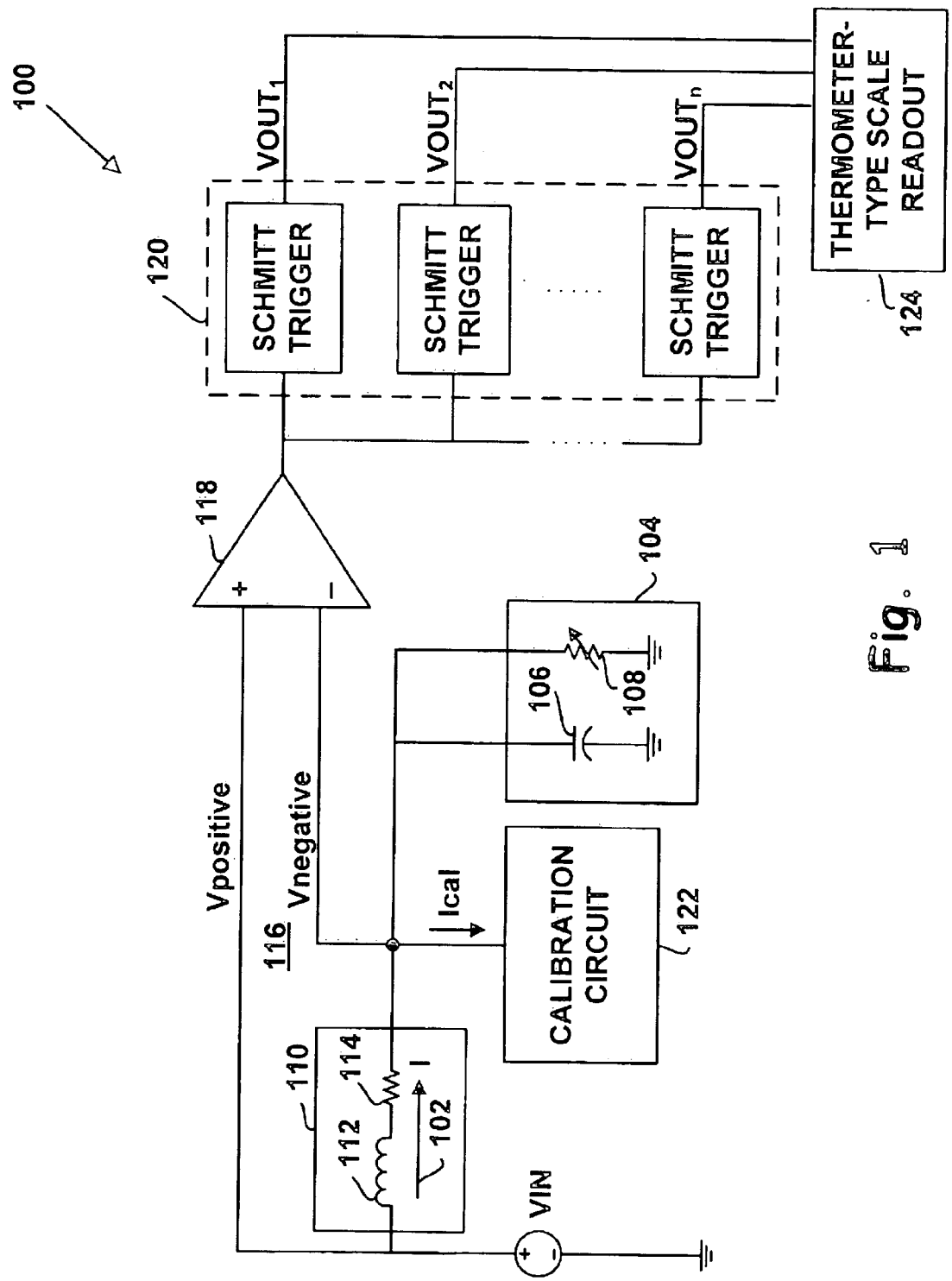
FIG. 1 is a circuit diagram of a current derivative sensor, according to an exemplary embodiment.

FIG. 1 is a circuit diagram of a current derivative sensor 100, according to an exemplary embodiment. The current derivative sensor 100 may include a sensing element 110, a gain circuit 118, an analog to digital (A/D) converter 120, and a calibration circuit 122. The sensor 100 may be a standalone device that can be inserted into a desired circuit to make measurements, or it may be fabricated on a die and interconnected to circuits on a separate die, or may be fabricated on the same die as the circuit being measured.

The current derivative sensor 100 may be designed to monitor current 102. The current 102 may be composed of both a DC component and a transient component. The current 102 may be generated by a load 104. The load 104 may be any conductor that can generate a transient current signal, such as integrated circuit interconnect metallization, integrated circuit polysilicon, silicided silicon connectors, printed circuit board traces, insulated wires, and non-insulated wires. For the sake of simplicity, the load 104 is depicted in FIG. 1 as a parallel combination of a capacitor 106 and a variable resistor 108.

The current 102 may be detected by the sensing element 110. The sensing element 110 preferably includes an inductor 112 placed in series with the load 104. A parasitic resistance may be associated with the inductor 112. The parasitic resistance is depicted in FIG. 1 as a resistor 114 located in series with the inductor 112. Other devices may also be included within the sensing element 110.

The current 102 may cause a differential potential 116 to develop across the series combination of the inductor 112 and the resistor 114 between the electrical nodes labeled in FIG. 1 as $V_{positive}$ and $V_{negative}$. The differential potential 116 may be generated from substantially three origins. A first origin may be a DC potential produced when the current 102 flows through the resistor 114. A second origin may be a transient potential produced when the current 102 flows through the resistor 114. A third origin may be transient potential produced when the current 102 flows through the inductor 112. The differential potential 116 may be defined by the following equation:

$$v(t)=(I+i(t))R+L(di/dt) \qquad \text{Equation 1}$$

where: v(t) is the differential potential 116;

I is the DC current flowing through the resistor 114;

i(t) is the transient current flowing through the resistor 114;

R is the resistance from resistor 114;

L is the inductance from inductor 112; and di/dt is the transient current flowing through the inductor 112.

The current derivative sensor 100 may be designed to measure substantially the third origin of the differential potential 116, which is the transient current di/dt flowing through the inductor 112.

The calibration circuit 122 may be used to calibrate the current derivative sensor 100. The calibration circuit 122 may be used to measure the parasitic resistance. Additionally, the calibration circuit 122 may be used to determine an accurate value of inductance of the inductor 112, which may be needed to correlate the differential potential 116 to the magnitude of the di/dt event. The details of the calibration circuit 122 are discussed below.

Figure 2A:
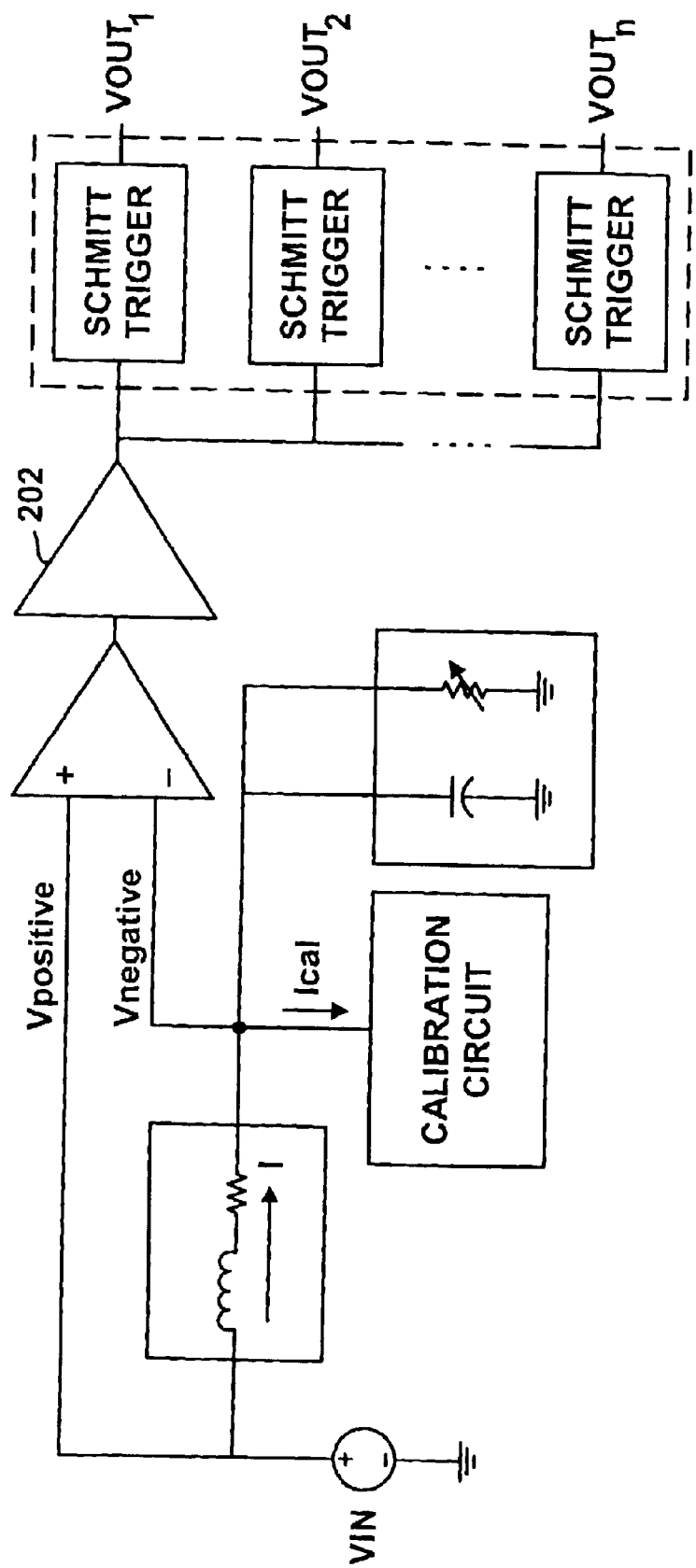
FIG. 2A is a circuit diagram of a current derivative sensor, according to another exemplary embodiment.
Figure 2B:
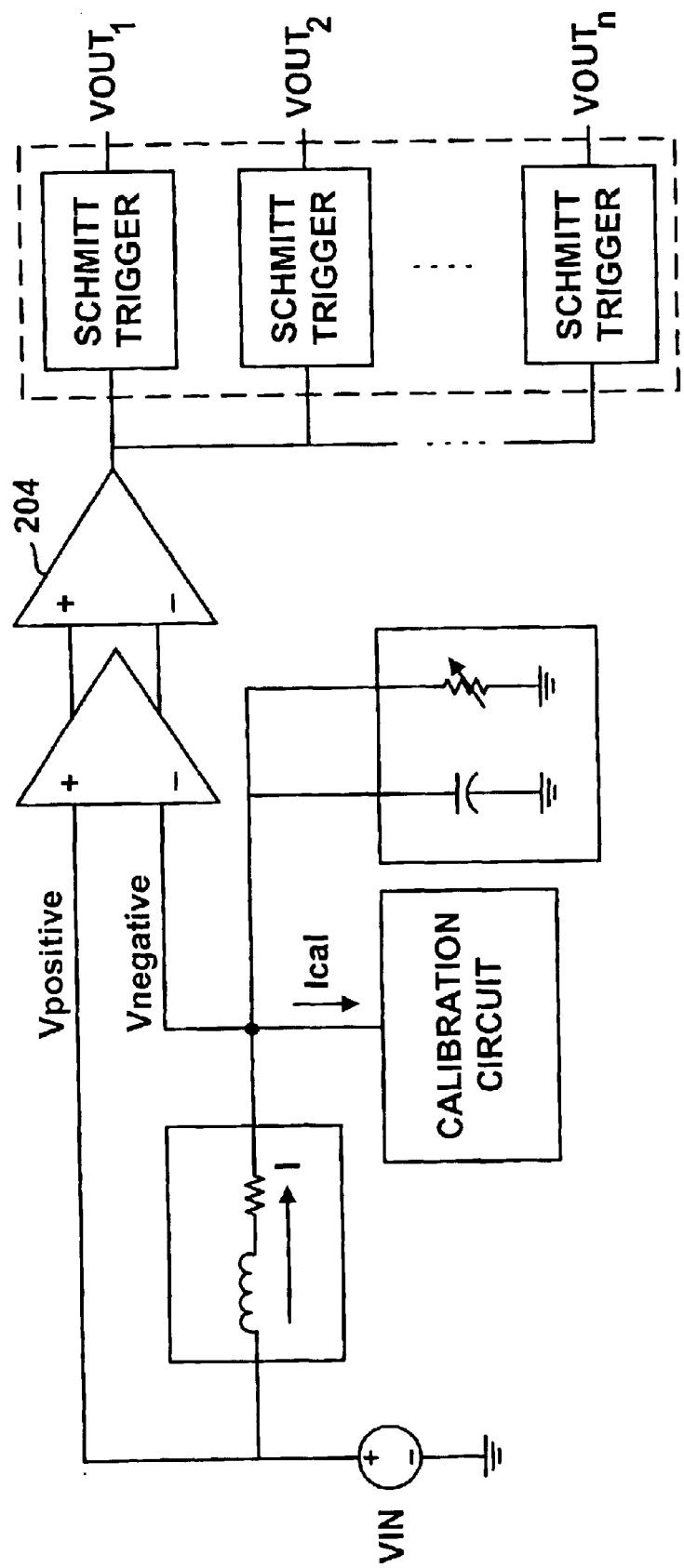
FIG. 2B is a circuit diagram of a current derivative sensor, according to another exemplary embodiment.

The gain circuit 118 may be used to amplify and convert the differential potential 116 to a single-ended output. The gain circuit 118 may be a differential-input, single-ended output operational amplifier (op amp). The addition of single-ended gain circuits 202 located at an output of the op amp may be beneficial for amplifying small differential potentials, as shown in FIG. 2A. Alternatively, additional differential-input, single-ended output gain circuits 204 located at the output of the op amp may be used to provide additional amplification for small differential potentials, as shown in FIG. 2B.

Referring back to FIG. 1, an output of the gain circuit 118 may be connected to the A/D converter 120, one embodiment of which is shown as a plurality of switches. While Schmitt triggers are used in a preferred embodiment, other switching devices or combination of devices that can be triggered may also be employed.

The Schmitt triggers may be configured such that LOW-to-HIGH input transition voltages are monotonically increasing from substantially a ground potential to a maximum supply voltage. The LOW-to-HIGH input transition voltage may be a value of voltage that causes a switch to change states from off to on. Alternatively, the LOW-to-HIGH input transition voltages may be monotonically increasing for a range of voltages located between the ground potential and the maximum supply voltage.

Additionally, the Schmitt triggers may be configured such that HIGH-to-LOW input transition voltages are substantially at the maximum supply voltage. The HIGH-to-LOW input transition voltage may be a value of voltage that causes a switch to change states from on to off.

In further alternative embodiments, the A/D converter 120 may be implemented using a series of voltage comparators having different reference voltages. Other suitable alternative analog to digital conversion techniques and circuits may also be used.

When a small di/dt event occurs, only the Schmitt triggers with a LOW-to-HIGH input transition voltage near the ground potential may change to a HIGH output. A larger di/dt event may cause an increasing number of the Schmitt triggers to change to a HIGH output. A change in state to a HIGH output may be maintained until the A/D converter 120 is reset.

Before being reset, the output of the A/D converter 120 may be detected providing an actual measurement of di/dt. The output of the A/D converter 120 may be displayed on a thermometer-type scale readout 124. For example, if none of the switches have changed to a HIGH output, then the readout may be substantially zero or at the bottom of the scale. As the number of switches that have changed to a HIGH output increases, the readout may be increased accordingly up the scale. When all of the switches have changed to a HIGH output, the readout may be substantially at full scale. This scale readout may be recorded. While the thermometer-type scale readout 124 is used in a preferred embodiment, other methods of displaying the output of the A/D converter 120 may also be employed.

In an alternative embodiment, the switch values may be converted to a binary number representing the number of switches in the HIGH state. For example, if there are seven switches, and a given output of gain circuit 118 causes the first five switches to change state (e.g., to a HIGH output from a LOW output), then the switch outputs may be converter by an encoder circuit (not shown) into the binary value "101". A suitable encoder circuit may be implemented using a digital counter to count the number of switch outputs in the HIGH state, a look-up table, a combinational logic circuit, etc.

Alternatively, the output of the A/D converter 120 may correspond to a memory address, such as a Read-Only-Memory (ROM) address. For this example, "101" may be stored in a ROM address corresponding to the first five switches being in the HIGH state.

Figure 3A:
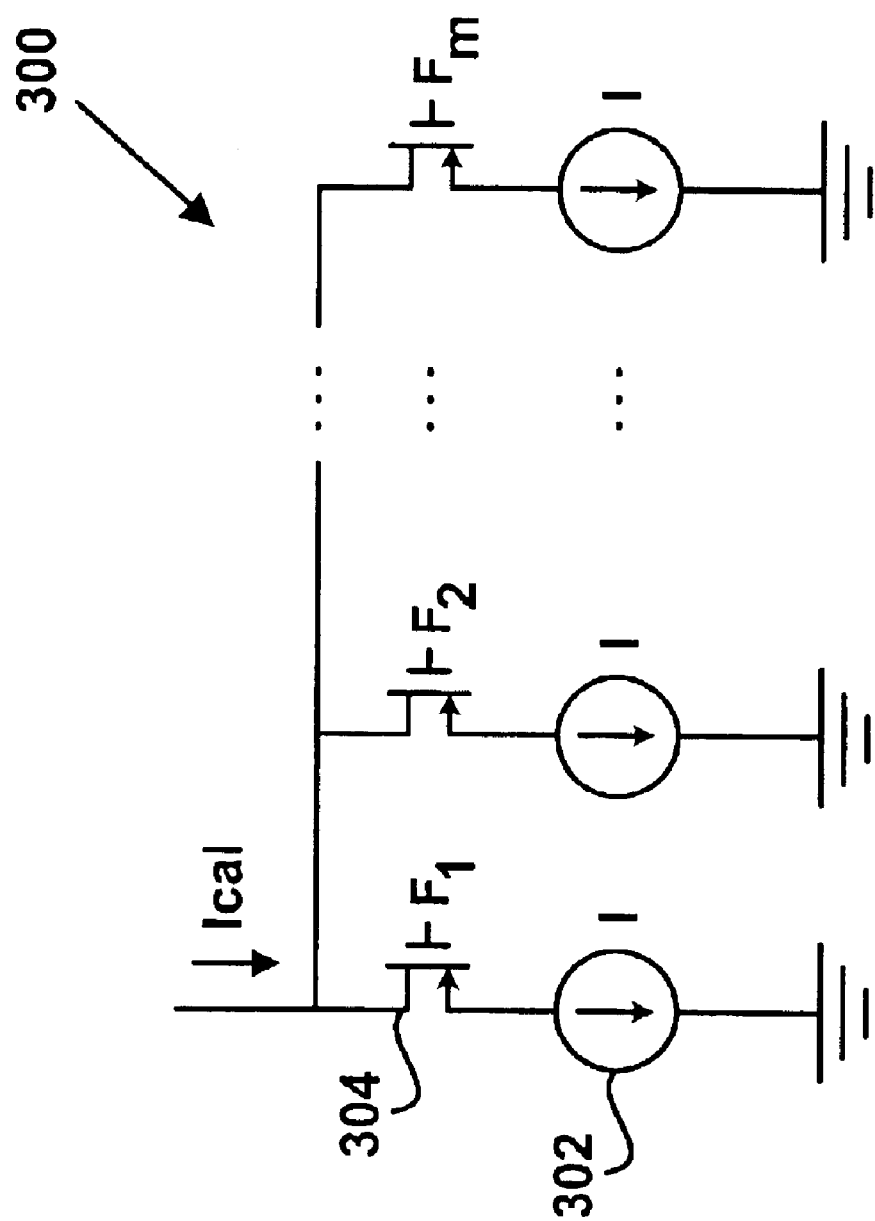
FIG. 3A is a circuit diagram of a calibration circuit, according to an exemplary embodiment.

FIG. 3A is a circuit diagram of a calibration circuit 300, according to an exemplary embodiment. The calibration circuit 300 is substantially the same as the calibration circuit 122 as shown in FIG. 1. The calibration circuit 300 includes a plurality of precision matched current sources 302 of substantially the same DC magnitude, I. The plurality of current sources 302 may be connected in parallel through independently controlled switches 304. FIG. 3A depicts the switches as field-effect transistors; however, other switches may be used. The independently controlled switches 304 may be controlled by a variety of devices, such as a microcontroller.

Activating a single leg of the parallel network of current sources 302 by closing one or more of the switches 304 may generate a known value of DC current when the current through the inductor 112 has reached steady state. Using the known value of DC current, a differential potential 116 may develop across resistor 114 and be amplified by the gain circuit 118. The AID converter 120 may detect the amplified differential potential signal. The output of the A/D converter 120 may be used to determine the value of the parasitic resistance, depicted in FIG. 1 as resistor 114.

Using the value of the parasitic resistance, the calibration circuit 300 may determine an accurate value of inductance of inductor 112, which may be needed to correlate the differential potential 116 to the magnitude of the di/dt event. A current with a known di/dt may be generated by incrementally activating successive legs of the parallel network of current sources 302 by closing the switches 304 one at a time. With each successive activation, the current generated may be increased by substantially the DC magnitude, I, of the current sources 302. Because the calibration circuit 300 is able to account for the contribution of the parasitic resistance, the circuit may accurately determine, or measure, the inductance. As seen with reference to Equation 1, the inductance is equal to the difference between the differential potential 116 and the contribution of the parasitic resistance, divided by the known di/dt.

Figure 3B:
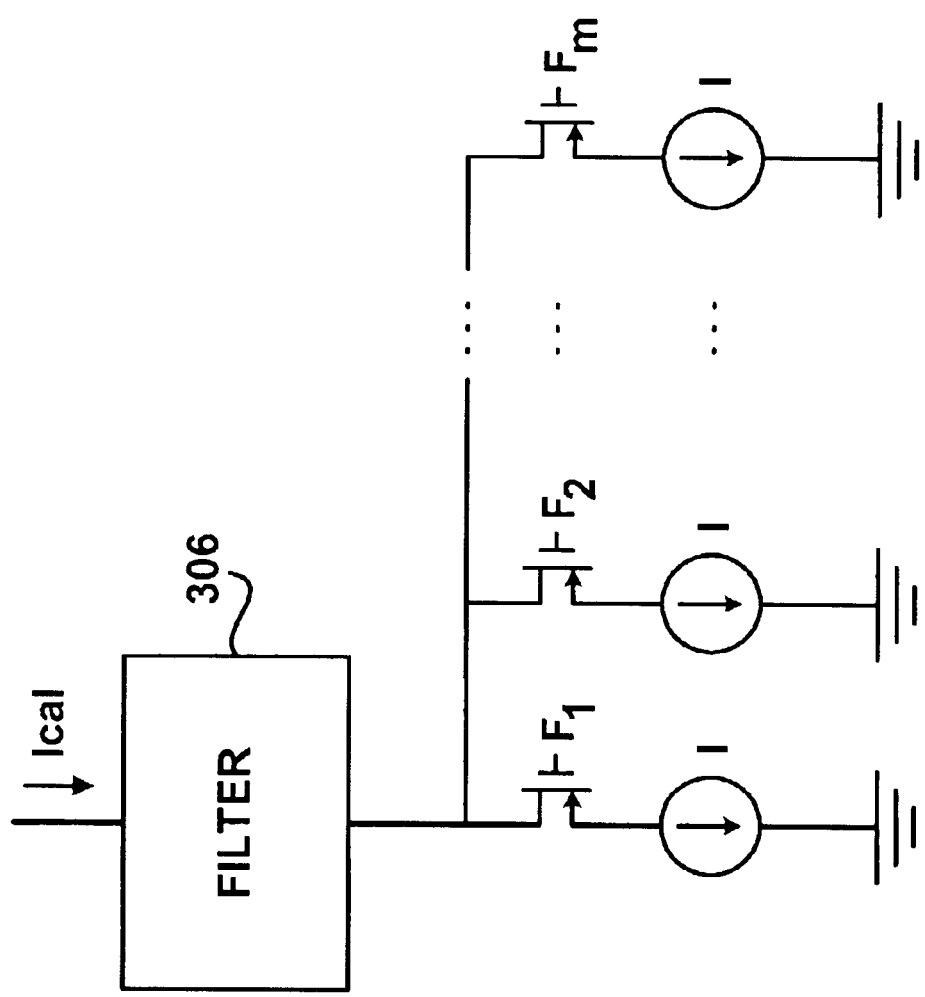
FIG. 3B is a circuit diagram of a calibration circuit, according to another exemplary embodiment.

A clock circuit or a timer may be used to control the successive activation of the legs of the parallel network of current sources 302. (The clock circuit and timer are not shown in FIG. 3A.) As shown in FIG. 3B, a filter 306 may be added to the calibration circuit 300, as the current waveform generated will have a staircase response. For example, the filter 306 may be a low pass filter. The addition of the low pass filter 306 may smooth the waveform, which may be a closer approximation of a ramp with a constant di/dt. Alternatively, because the ramp response ideally contains only odd-order harmonics, a filter 306 operable to remove even-order harmonics may be added to the calibration circuit 300.

In an alternative embodiment, the calibration circuit 300 may include a control circuit. (The control circuit is not shown in FIG. 1.) The control circuit may include a microcontroller. Alternatively, the control circuit may include a logic circuit providing combinational and/or sequential logic. For example, the logic circuit may be a state machine.

The control circuit may be operable to provide the known value of DC current by controlling the operation of independently controlled switches 304. The control circuit may open and close switches 304 based on what type of calibration is being performed.

In addition, the control circuit may receive voltage information from the output of the gain circuit 118 and/or the A/D converter 120. The control circuit may receive the voltage information for various DC current values. For example, the control circuit may receive the voltage information for different combinations of switches 304 being opened and closed. The control circuit may store the voltage information for the various DC current values.

When the current derivative sensor 100 is operating, the control circuit may receive the voltage information from the output of the gain circuit 118 and/or the A/D converter 120 and subtract the previously stored voltage information for the corresponding DC level. As such, the control circuit may provide an output signal that has been compensated for the DC component of current.

Additionally, the control circuit may provide an offset value based on the DC component of current to the gain circuit 118. Furthermore, for the A/D embodiment using voltage comparators, the control circuit may provide the different reference voltages to the voltage comparators. The different reference voltages may or may not be linearly spaced.

To maximize the sensitivity of the current derivative sensor 100, the inductive component of the differential potential 116 may be emphasized, minimizing the resistive component. Referring back to Equation 1, to emphasize the inductive component, the following equation holds true.

$$L(di/dt) \gg (I+i(t))R \qquad \text{Equation 2}$$

The inductive component is related to the quality factor Q of the inductor. The quality factor can be defined as:

$$Q=\omega L/R=2\pi f L/R \qquad \text{Equation 3}$$

where: ω is the angular frequency of an AC signal and f is the equivalent frequency in Hertz. If the AC signal is represented by only its fundamental frequency then:

$$di/dt=2f. \qquad \text{Equation 4}$$

Combining Equations 2, 3, and 4 yields the following design equation:

$$Q \gg \pi(1+I/i). \qquad \text{Equation 5}$$

Figure 4:
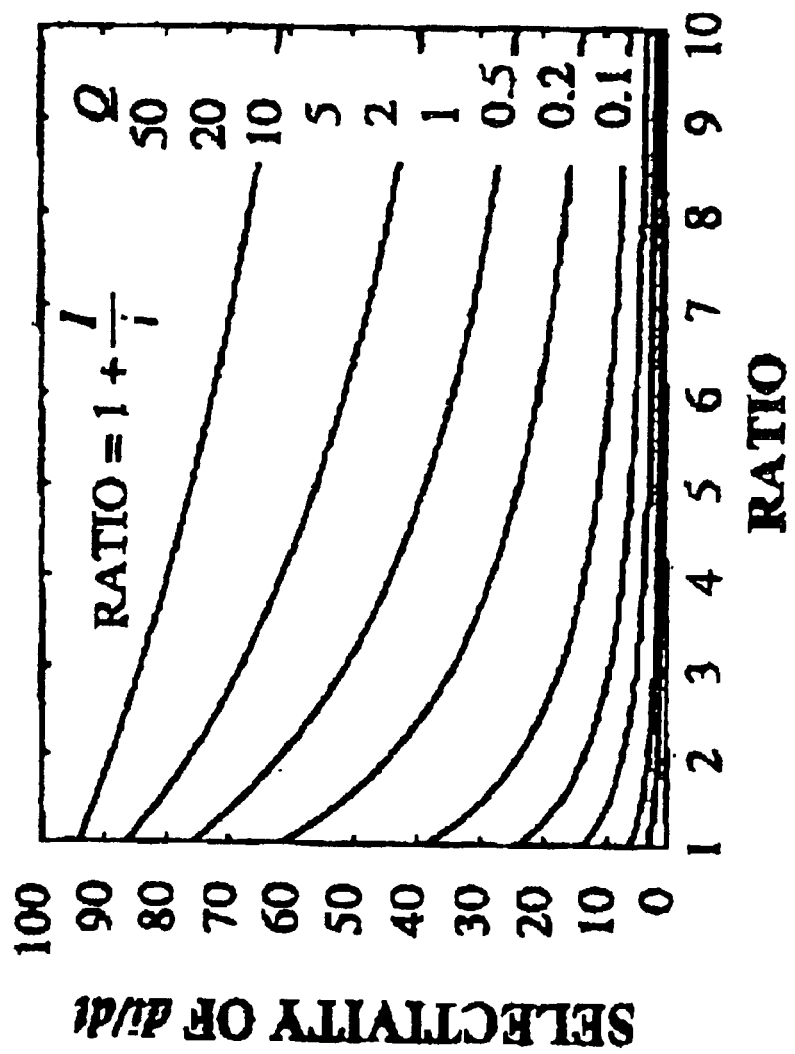
FIG. 4 is a graph of selectivity of the sensor, according to an exemplary embodiment.

The significance of the design equation, Equation 5, on the performance of the sensor is shown graphically in FIG. 4. FIG. 4 depicts the selectivity of the current derivative sensor 100. The selectivity of the current derivative sensor 100 may be defined as the percentage of the differential potential 116 due to the inductive contribution, L(di/dt).

A ratio is defined between the DC current I and the transient current i. A high ratio may imply that the total current 102 is nearly constant with small transient variations. In this situation, the inductive contribution would not be emphasized, and the selectivity would be low. This may cause the scaled output to be largely a result of the parasitic resistance. On the other hand, a low ratio may imply that the current 102 is dominated by the transient current i.

The impact of the quality factor is also depicted in FIG. 4. A larger value of Q results in a higher selectivity of the inductive contribution. A high value of Q may be indicative of either a high value of di/dt or a low value of resistance 114. Conversely, a low value of Q may be indicative of either a low value of di/dt or a high value of resistance 114.

Figure 5:
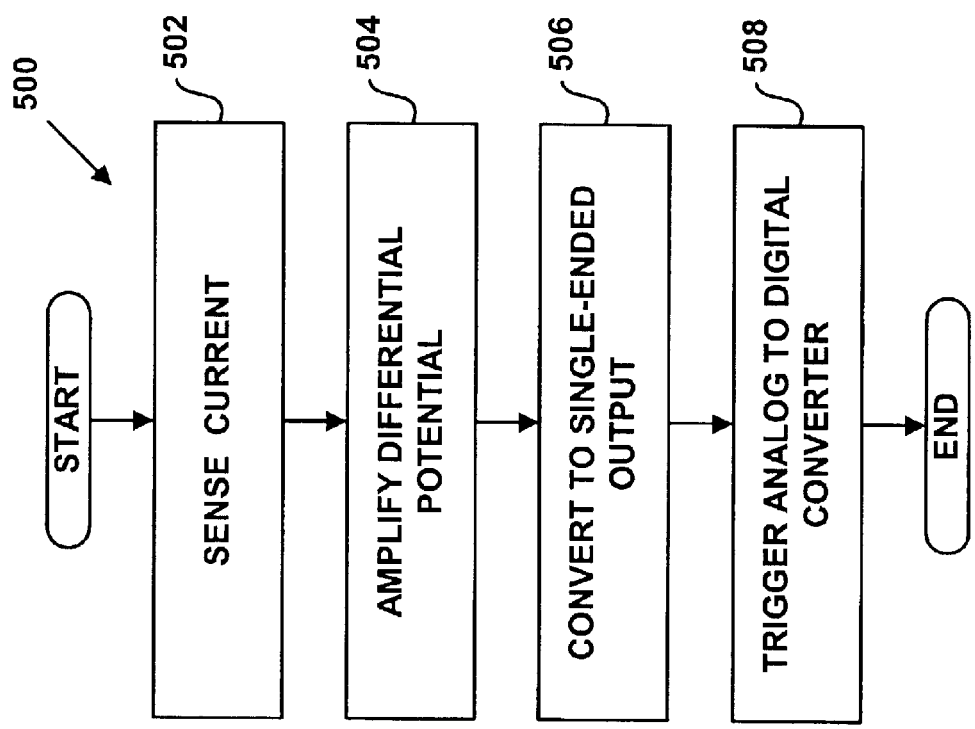
FIG. 5 is a flow chart diagram of a method of measuring a time derivative of a current signal (di/dt), according to an exemplary embodiment.

FIG. 5 depicts a flow chart diagram of a method 500 of measuring a time derivative of a current signal (di/dt). Step 502 is sensing the current. The sensing element 110 may be used to sense the current 102 generated by the load 104. The differential potential 116 may be generated as the current 102 flows through the sensing element 110.

Step 504 is amplifying the differential potential 116. The gain circuit 118 may be used to amplify the differential potential 116. The gain circuit 118 may include additional gain circuits 202, 204 to provide more amplification for small differential potentials. In an alternative embodiment, results from the calibration circuit 300, such as the inductance value, may be used to set the gain of the gain circuit 118.

Step 506 is converting the differential potential 116 to a singled-ended output. This step may be accomplished using the same gain circuit 118 used for amplification in Step 504.

Step 508 is triggering the A/D converter. The A/D converter may be a plurality of Schmitt triggers configured such that the input transition voltage operable to trigger a switch from off to on is monotonically increasing from switch to switch. Only the switches with transition voltages at or below the voltage applied by the gain circuit 118 will turn on. The number of switches that turn on for a given period of time is representative of the time derivative of the current signal 102. The greater the value of voltage at the output of the gain circuit 118, the greater the number of switches that will turn on, which represents a greater rate of current change.

The output of the A/D converter 120 may be displayed on a thermometer-type scale readout 124, which may then be recorded. In an alternative embodiment, the switch values may be converted to a binary number representing the number of switches in the HIGH state as previously discussed.

The current derivative sensor 100 may be able to detect electromagnetic interference and/or radio-frequency interference. For example, the current derivative sensor 100 may be able to detect di/dt events ranging from $10^3$ amps/second (or 1 amp/millisecond) to $10^{12}$ amps/second (or 1 amp/picosecond). However, other results may be possible based on the effects of the parasitic resistance depicted in FIG. 1 as resistor 114, the quality factor of the inductor 112, and a limit on the gain circuit 118, which may be imposed by the maximum supply voltage. The ability to measure such a wide range of di/dt events makes the current derivative sensor 100 ideally suited for applications involving integrated circuits, printed circuit boards, insulated and non-insulated wiring, and other electrical conductors.

It should be understood that the illustrated embodiments are exemplary only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A current derivative sensor, comprising in combination:
   a sensing element operable to detect current, wherein the current flows through the sensing element, thereby generating a differential potential across the sensing element; and
   an analog to digital converter providing an output representative of a time derivative of a current signal (di/dt);
   wherein the sensing element is an inductor located in series with a load; and
   wherein parasitic resistance is associated with the inductor.

2. The current derivative sensor of claim 1, further comprising a gain circuit operable to amplify and convert the differential potential to a single-ended output.

3. The current derivative sensor of claim 2, wherein the gain circuit is an operational amplifier.

4. The current derivative sensor of claim 3, wherein the gain circuit includes a single-ended gain circuit located at an output of the operational amplifier.

5. The current derivative sensor of claim 3, wherein the gain circuit includes a second differential-input, single-ended gain circuit located at an output of the operational amplifier.

6. The current derivative sensor of claim 1, wherein a load generates the current.

7. The current derivative sensor of claim 6, wherein the load is a conductor operable to generate a transient current signal.

8. The current derivative sensor of claim 6, wherein the load is a conductor selected from the group consisting of integrated circuit interconnect metallization, integrated circuit polysilicon, silicided silicon connectors, printed circuit board traces, insulated wires, and non-insulated wires.

9. The current derivative sensor of claim 1, wherein the output is displayed on a thermometer-type scale readout.

10. A current derivative sensor, comprising in combination:
   a sensing element operable to detect current, wherein the current flows through the sensing element, thereby generating a differential potential across the sensing element; and
   an analog to digital converter providing an output representative of a time derivative of a current signal (di/dt);
   wherein the differential potential consists of a DC potential produced as the current flows through parasitic resistance located in the sensing element, a transient potential produced as the current flows through the parasitic resistance, and a transient potential produced as the current flows through an inductor in the sensing element.

11. The current derivative sensor of claim 10, further comprising a gain circuit operable to amplify and convert the differential potential to a single-ended output.

12. The current derivative sensor of claim 11, wherein the gain circuit is an operational amplifier.

13. The current derivative sensor of claim 12, wherein the gain circuit includes a single-ended gain circuit located at an output of the operational amplifier.

14. The current derivative sensor of claim 12, wherein the gain circuit includes a second differential-input, single-ended gain circuit located at an output of the operational amplifier.

15. The current derivative sensor of claim 10, wherein a load generates the current.

16. The current derivative sensor of claim 15, wherein the load is a conductor operable to generate a transient current signal.

17. The current derivative sensor of claim 15, wherein the load is a conductor selected from the group consisting of integrated circuit interconnect metallization, integrated circuit polysilicon, silicided silicon connectors, printed circuit board traces, insulated wires, and non-insulated wires.

18. The current derivative sensor of claim 10, wherein the output is displayed on a thermometer-type scale readout.

19. A current derivative sensor, comprising in combination:
   a sensing element operable to detect current, wherein the current flows through the sensing element, thereby generating a differential potential across the sensing element;
   an analog to digital converter providing an output representative of a time derivative of a current signal (di/dt); and
   a calibration circuit operable to determine a parasitic resistance value.

20. The current derivative sensor of claim 19, wherein the calibration circuit determines an inductive value using the parasitic resistance value.

21. The current derivative sensor of claim 19, wherein the calibration circuit includes a plurality of precision matched current sources connected in parallel through independently controlled switches.

22. The current derivative sensor of claim 21, wherein the plurality of precision matched current sources provides substantially identical current magnitudes.

23. The current derivative sensor of claim 21, wherein the independently controlled switches are field-effect transistors.

24. The current derivative sensor of claim 19, further comprising a gain circuit operable to amplify and convert the differential potential to a single-ended output.

25. The current derivative sensor of claim 24, wherein the gain circuit is an operational amplifier.

26. The current derivative sensor of claim 25, wherein the gain circuit includes a single-ended gain circuit located at an output of the operational amplifier.

27. The current derivative sensor of claim 25, wherein the gain circuit includes a second differential-input, single-ended gain circuit located at an output of the operational amplifier.

28. The current derivative sensor of claim 19, wherein a load generates the current.

29. The current derivative sensor of claim 28, wherein the load is a conductor operable to generate a transient current signal.

30. The current derivative sensor of claim 28, wherein the load is a conductor selected from the group consisting of integrated circuit interconnect metallization, integrated circuit polysilicon, silicided silicon connectors, printed circuit board traces, insulated wires, and non-insulated wires.

31. The current derivative sensor of claim 19, wherein the output is displayed on a thermometer-type scale readout.

32. A current derivative sensor, comprising in combination:
   a sensing element operable to detect current, wherein the current flows through the sensing element, thereby generating a differential potential across the sensing element; and
   an analog to digital converter providing an output representative of a time derivative of a current signal (di/dt);
   wherein the analog to digital converter includes a plurality of Schmitt triggers.

33. The current derivative sensor of claim 32, wherein the plurality of Schmitt triggers are configured with LOW-to-HIGH input transition voltages that are monotonically increasing from substantially a ground potential to a maximum supply voltage.

34. The current derivative sensor of claim 32, wherein the plurality of Schmitt triggers are configured with HIGH-to-LOW input transition voltages that are substantially at maximum supply voltage.

35. The current derivative sensor of claim 32, wherein the plurality of Schmitt triggers stay on until reset.

36. The current derivative sensor of claim 32, further comprising a gain circuit operable to amplify and convert the differential potential to a single-ended output.

37. The current derivative sensor of claim 36, wherein the gain circuit is an operational amplifier.

38. The current derivative sensor of claim 37, wherein the gain circuit includes a single-ended gain circuit located at an output of the operational amplifier.

39. The current derivative sensor of claim 37, wherein the gain circuit includes a second differential-input, single-ended gain circuit located at an output of the operational amplifier.

40. The current derivative sensor of claim 32, wherein a load generates the current.

41. The current derivative sensor of claim 40, wherein the load is a conductor operable to generate a transient current signal.

42. The current derivative sensor of claim 40, wherein the load is a conductor selected from the group consisting of integrated circuit interconnect metallization, integrated circuit polysilicon, silicided silicon connectors, printed circuit board traces, insulated wires, and non-insulated wires.

43. The current derivative sensor of claim 32, wherein the output is displayed on a thermometer-type scale readout.

44. A current derivative sensor, comprising in combination:

an inductor operable to detect current, wherein the current flows through the inductor, thereby generating a differential potential across the inductor; an operational amplifier operable to amplify and convert the differential potential to a single-ended output; and a plurality of Schmitt triggers configured to switch from off to on at monotonically increasing transition voltages, wherein the plurality of Schmitt triggers provide an output representative of a time derivative of a current signal (di/dt).

45. The current derivative sensor of claim 44, wherein a single-ended gain circuit is located at an output of the operational amplifier.

46. The current derivative sensor of claim 44, wherein a differential-input, single-ended gain circuit is located at an output of the operational amplifier.

47. The current derivative sensor of claim 44, wherein a load generates the current.

48. The current derivative sensor of claim 47, wherein the load is a conductor operable to generate a transient current signal.

49. The current derivative sensor of claim 47, wherein the load is a conductor selected from the group consisting of integrated circuit interconnect metallization, integrated circuit polysilicon, silicided silicon connectors, printed circuit board traces, insulated wires, and non-insulated wires.

50. The current derivative sensor of claim 44, wherein the inductor is located in series with a load.

51. The current derivative sensor of claim 44, wherein parasitic resistance is associated with the inductor.

52. The current derivative sensor of claim 44, wherein the differential potential consists of a DC potential produced as the current flows through parasitic resistance located in the sensing element, a transient potential produced as the current flows through the parasitic resistance, and a transient potential produced as the current flows through an inductor in the sensing element.

53. The current derivative sensor of claim 44, further comprising a calibration circuit operable to determine a parasitic resistance value.

54. The current derivative sensor of claim 53, wherein the calibration circuit determines an inductive value using the parasitic resistance value.

55. The current derivative sensor of claim 53, wherein the calibration circuit includes a plurality of precision matched current sources connected in parallel through independently controlled switches.

56. The current derivative sensor of claim 55, wherein the plurality of precision matched current sources provide substantially identical current magnitudes.

57. The current derivative sensor of claim 55, wherein the independently controlled switches are field-effect transistors.

58. The current derivative sensor of claim 44, wherein the plurality of Schmitt triggers are configured with LOW-to-HIGH input transition voltages that are monotonically increasing from substantially a ground potential to a maximum supply voltage.

59. The current derivative sensor of claim 44, wherein the plurality of Schmitt triggers are configured with HIGH-to-LOW input transition voltages that are substantially at maximum supply voltage.

60. The current derivative sensor of claim 44, wherein the plurality of Schmitt triggers stay on until reset.

61. The current derivative sensor of claim 44, wherein the output is displayed on a thermometer-type scale readout.

62. A method of measuring a time derivative of a current signal (di/dt), comprising in combination:

sensing current from a load, thereby generating a differential potential;

amplifying the differential potential;

converting the differential potential to a single-ended output; and triggering an analog to digital converter based on the differential potential, thereby providing an output representative of a time derivative of a current signal (di/dt);

wherein the differential potential consists of a DC potential produced as the current flows through parasitic resistance located in the sensing element, a transient potential produced as the current flows through the parasitic resistance, and a transient potential produced as the current flows through an inductor in the sensing element.

63. The method of claim 62, wherein the load is a conductor operable to generate a transient current signal.

64. The method of claim 62, wherein the load is a conductor selected from the group consisting of integrated circuit interconnect metallization, integrated circuit polysilicon, silicided silicon connectors, printed circuit board traces, insulated wires, and non-insulated wires.

65. The method of claim 62, wherein a differential-input, single-ended output gain circuit is operable to amplify and convert the differential potential.

66. The method of claim 62, further comprising displaying an output of the analog to digital converter on a thermometer-type scale readout.

67. A method of measuring a time derivative of a current signal (di/dt), comprising in combination:

sensing current from a load, thereby generating a differential potential;

amplifying the differential potential;

converting the differential potential to a single-ended output; and triggering an analog to digital converter based on the differential potential, thereby providing an output representative of a time derivative of a current signal (di/dt);

wherein the analog to digital converter includes a plurality of Schmitt triggers.

68. The method of claim 67, wherein the load is a conductor operable to generate a transient current signal.

69. The method of claim 67, wherein the load is a conductor selected from the group consisting of integrated circuit interconnect metallization, integrated circuit polysilicon, silicided silicon connectors, printed circuit board traces, insulated wires, and non-insulated wires.

70. The method of claim 67, wherein a differential-input, single-ended output gain circuit is operable to amplify and convert the differential potential.

71. The method of claim 67, further comprising displaying an output of the analog to digital converter on a thermometer-type scale readout.

* * * * *